United States Patent
Sugino

(10) Patent No.: US 9,793,694 B2
(45) Date of Patent: Oct. 17, 2017

(54) SHIELDED CONDUCTIVE PATH

(71) Applicant: SUMITOMO WIRING SYSTEMS, LTD., Yokkaichi, Mie (JP)

(72) Inventor: Hidetoshi Sugino, Yokkaichi (JP)

(73) Assignee: SUMITOMO WIRING SYSTEMS, LTD., Mie (JP)

( * ) Notice: Subject to any disclaimer, the term of this patent is extended or adjusted under 35 U.S.C. 154(b) by 0 days.

(21) Appl. No.: 14/704,617

(22) Filed: May 5, 2015

(65) Prior Publication Data

US 2015/0334882 A1    Nov. 19, 2015

(30) Foreign Application Priority Data

May 15, 2014   (JP) ................... 2014-101197

(51) Int. Cl.
| | |
|---|---|
| H05K 9/00 | (2006.01) |
| H02G 3/04 | (2006.01) |
| B60R 16/02 | (2006.01) |
| H02G 1/08 | (2006.01) |
| H02G 3/06 | (2006.01) |

(52) U.S. Cl.
CPC ....... *H02G 3/0481* (2013.01); *B60R 16/0215* (2013.01); *H02G 1/08* (2013.01); *H05K 9/0098* (2013.01); *H02G 3/0406* (2013.01); *H02G 3/06* (2013.01); *H02G 3/0616* (2013.01); *Y10T 29/49828* (2015.01)

(58) Field of Classification Search
CPC ......................... H05K 9/0098; H02G 3/0481
See application file for complete search history.

(56) References Cited

U.S. PATENT DOCUMENTS

| | | | |
|---|---|---|---|
| 2004/0099427 A1 | 5/2004 | Kihira | |
| 2005/0045357 A1* | 3/2005 | Ichikawa | B60R 16/0215 174/50 |
| 2009/0107694 A1* | 4/2009 | Watanabe | H01B 7/16 174/102 R |
| 2012/0312595 A1* | 12/2012 | Sawada | B60R 16/0215 174/72 A |
| 2015/0017829 A1* | 1/2015 | Ishikawa | H01R 9/032 439/460 |
| 2015/0263496 A1* | 9/2015 | Sugino | H02G 3/0437 174/95 |

FOREIGN PATENT DOCUMENTS

JP   2004-171952 A   6/2004

\* cited by examiner

*Primary Examiner* — Hung V Ngo
(74) *Attorney, Agent, or Firm* — Oliff PLC

(57) ABSTRACT

A shielded conductive path capable of being easily managed in terms of a length of a portion of a single core wire protruding from a shield pipe includes a shield pipe electromagnetically shielding a plurality of single core wires inserted therein and a spacer having insertion holes individually receiving the single core wires. Each single core is made of a single conductor as a core wire. The spacer is fitted inside of the shield pipe while being restricted from displacement in directions perpendicular to an axial direction of the shield pipe.

21 Claims, 6 Drawing Sheets

SHIELDED CONDUCTIVE PATH

BACKGROUND

The present disclosure relates to a shielded conductive path.

BACKGROUND

Conventionally, in vehicles such as hybrid automobiles, a plurality of wires are disposed under a floor of the vehicle in order to connect a device such as a high voltage battery provided at a rear part of the vehicle, for example, with a device such as an inverter or a fuse box provided at a front part of the vehicle. Regarding this configuration, it is known that wires may be inserted into a metallic shield pipe for protecting the wires from interference of contaminants as well as for electromagnetic shielding (see, e.g., JP 2004-171952A). A shielded conductive path, such as that described in JP 2004-171952A having this configuration is inserted into the shield pipe and then processed by means of a bending process so as to extend along a predetermined routing path after the wires.

Most of the wires inserted into shield pipes are core wires formed of stranded wires which are formed by bundling and twisting a plurality of bare wires. In order to insert the flexible stranded wire into the shield pipe, it is necessary to increase a diameter of the shield pipe to some extent. However, in the shielded conductive path arranged under the floor of the vehicle, it is desirable to decrease the diameter of the shield pipe in consideration of minimum ground clearance. To accommodate this, it is conceivable that the wire is formed of a single core wire which is made of a single conductor as a core wire, instead of the stranded wire described above, making it possible to decrease the diameter of the wire itself. In addition, the single core wire is less flexible and can be inserted into a shield pipe having a small diameter, so that it is conceivable to decrease the diameter of the shield pipe.

However, there is a difficulty in setting a length of a portion of the single core wire protruding from the shield pipe to a desired length. This difficulty arises from the length of the portion protruding from the shield pipe varying depending on the position of the single core wire inside the shield pipe in the process of bending the shield pipe. For example, if the single core wires have the same length, the length of the portion protruding from the shield pipe is larger for a single core wire running inside than for a single core wire running outside at a curve of the shield pipe. The adjustment in the length of the portion protruding from the shield pipe can be made for the wires by warping the stranded wire after the bending process. However, the single core is less flexible, and it is difficult to make such an adjustment after the bending process.

The plurality of the single core wires inserted into the shield pipe are different from each other in the length of the portion protruding from the shield pipe, because the positions of the single core wires are biased inwardly or outwardly, or deviated inwardly and outwardly. The shield pipe is bent three-dimensionally, making it very difficult to predict the positions of the single core wires after the bending process. It is difficult to predict the length of the portion protruding from the shield pipe in advance in order to set the length to a predetermined length. A solution for this problem is desired.

The present disclosure has been accomplished in view of the above problems, and is aimed to provide a shielded conductive path capable of being easily managed in terms of the length of the portion protruding from the shield pipe.

SUMMARY

A shielded conductive path of the present disclosure is provided with a shield pipe electromagnetically shielding a plurality of single core wires inserted into the shield pipe and a spacer having insertion holes individually receiving the single core wires. The single cores are respectively made of a single conductor as a core wire. The spacer is fitted inside of the shield pipe while being restricted from displacement in directions perpendicular to an axial direction of the shield pipe.

According to the present disclosure, the single core wires are securely positioned in the directions perpendicular to the axial direction of the shield pipe, making it possible to predict a length of a portion protruding from the shield pipe after the bending process. Therefore, it is possible to easily manage the length of the portion of the single core wires protruding from the shield pipe.

DESCRIPTION OF THE EMBODIMENTS

Preferable embodiments of the present disclosure will be shown below. In the above-described shielded conductive path of the present disclosure, the spacer may be fit to a curved portion of the shield pipe, the curved portion being formed by means of a bending process. In this configuration, single core wire is positioned securely at the curve of the shield pipe which is the most easily displaced, making it possible to be efficiently positioned.

In the shielded conductive path of the present disclosure, the spacer may have paired segments (i.e. a pair of segments), which are unified to interpose the single core wires therebetween. In this configuration, the paired segments are unified to interpose a predetermined portion of the single core wire such that the spacer is attached at a predetermined portion, making it possible to facilitate the attachment of the spacer, compared to the case of inserting the spacer from one end of the single core wire to the predetermined portion.

In the shielded conductive path of the present disclosure, the shield pipe can be formed into a tubular shape capable of receiving therein the single core wires by unifying paired segments which are segmented along an axial direction. In this configuration, the spacer and the single core wire are disposed in one of the segments, and then the segment is unified to the other segment, making it possible to dispose the spacer and the single core wire within the shield pipe.

Accordingly, it is possible to facilitate assembly of the shield pipe compared to the case of inserting a spacer-attached single core wire, which is formed by attaching the spacer at a predetermined portion in advance, from one end side to the other end side of the shield pipe.

In the shielded conductive path of the present disclosure, the shield pipe may have a flattened cross-sectional shape which is elongated along a horizontal direction when installed on a vehicle. In this configuration, it is possible to reduce a height of the shield pipe.

Example 1

Hereinafter, Example 1 embodying the present disclosure will be explained in detail with reference to FIG. 1-4.

Figure 1:
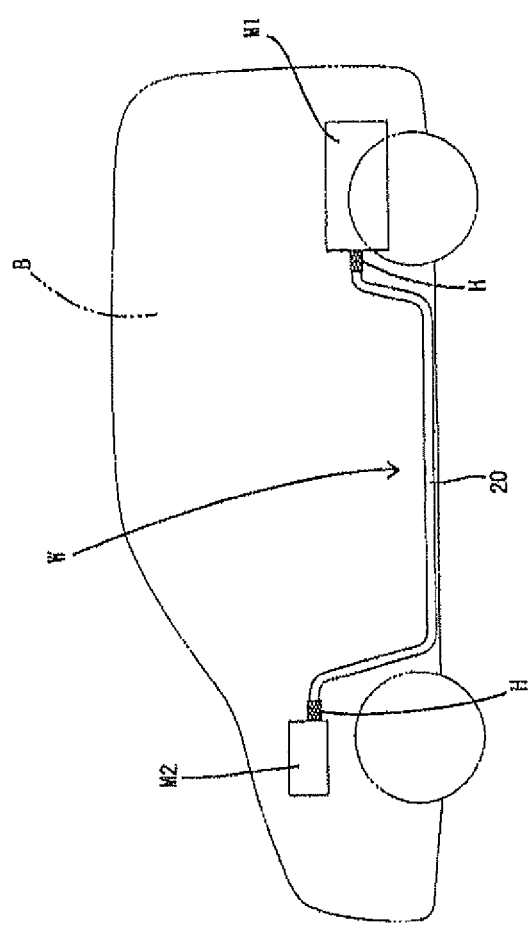
FIG. 1 is a schematic lateral view showing a routing path of a shielded conductive path according to Example 1.

The shielded conductive path W in this embodiment is disposed under a floor of a vehicle B, such as a hybrid vehicle, in order to connect a device M1 such as a high voltage battery provided at a rear part of the vehicle B, for example, with a device M2 such as an inverter or a fuse box provided at a front part of the vehicle B, as shown in FIG. 1. The devices M1, M2 are accommodated within an electrically conductive shield case.

The shielded conductive path W in this embodiment serves to shield electromagnetically a plurality (two in this embodiment) of single core wires 10 inserted into an interior of a shield pipe 20. The single core wires 10 are non-shielded wires (see FIG. 4), which are formed by covering an outer circumference of one metal bar conductor 11 with a dielectric coating 12. The conductor 11 of the single core wire 10 is made of copper, a copper alloy, aluminum, or an aluminum alloy, formed into a circular cross-sectional shape, and exhibits high rigidity with low flexibility.

Figure 2:
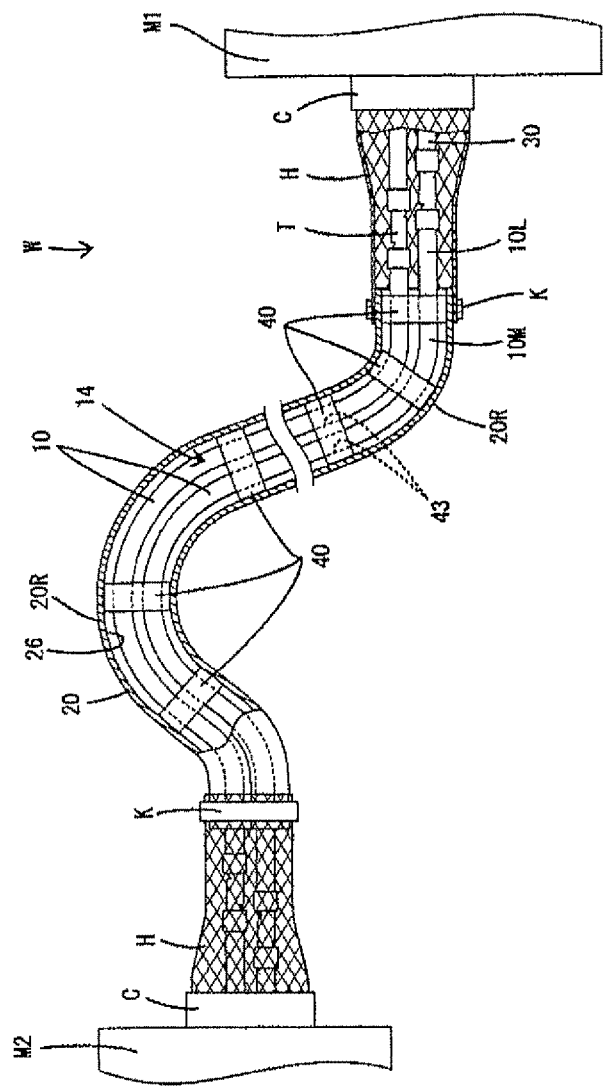
FIG. 2 is a partially expanded lateral cross-sectional view showing curves and both ends of the shielded conductive path.

Both ends of the single core wire 10 protrude from the shield pipe 20 as shown in FIG. 2. Hereinafter, a portion of the single core wire 10 that is disposed inside of the shield pipe 20 is referred to as a main portion 10M, and a portion of the single core wire 10 that protrudes from the shield pipe 20 is referred to as a protruding portion 10L. The two single core wires 10 differ from each other in the length of the protruding portions 10L.

The conductor 11 is exposed at the end of the protruding portion 10L of each single core wire 10 by removing the dielectric coating 12 over a predetermined range. The exposed conductor 11 is formed into a plate-shaped squeezed portion 13 which is formed by squeezing from one side. An end of a stranded wire 30 is connected to the squeezed portion 13.

The stranded wire 30 is a non-shielded wire which is formed by covering an outer circumference of a core wire 31 with a dielectric cover 32. The core wire 31 is formed by bundling and spirally twisting a plurality of wires. Each wire is made of copper, a copper alloy, aluminum, or an aluminum alloy. The core wire 31 of the stranded wire 30 exhibits high rigidity with low flexibility.

Figure 3:
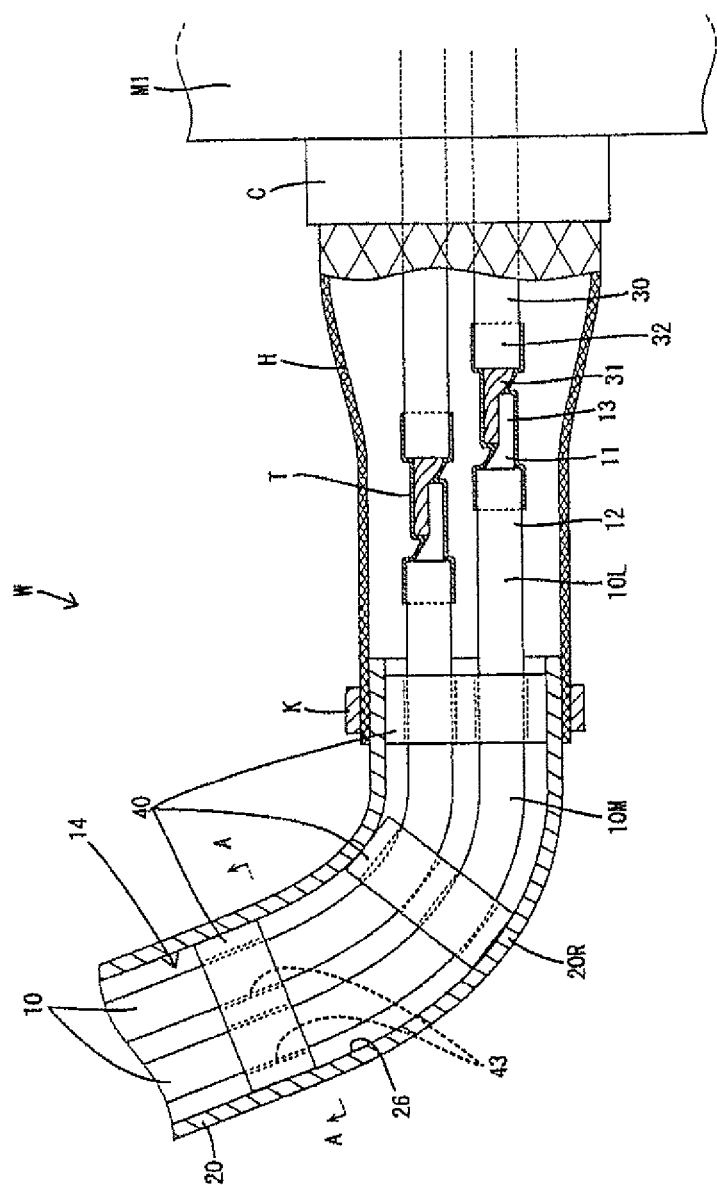
FIG. 3 is a lateral cross-sectional view expanded around a portion where a single core wire is connected to a stranded wire.

The dielectric cover 32 is removed at both ends of the stranded wire 30 respectively over predetermined ranges, and the core wire 31 is exposed (see FIG. 3). One of both ends of the stranded wire 30 is adhered to the squeezed portion 13 of the single core wire 10 by means of soldering, welding or the like, while the other end is connected to a terminal fitting not shown in drawings. The terminal fittings are accommodated within a connector C. The connector C is fit into the connector of the device M1 or M2, enabling an electrical connection with device M1 or M2.

The portion connecting the single core wire 10 with the stranded wire 30 is covered with a thermally shrinkable tube T over its entire circumference. The thermally shrinkable tube T is attached to cover and link the dielectric coating 12 of the single core wire 10 to the dielectric cover 32 of the stranded wire 30. In this configuration, the portion connecting the single core wire 10 with the stranded wire 30 is maintained at an insulating state or a sealed state.

The protruding portion 10L of the single core wire 10 and that portion of the stranded wire 30 that protrudes from the connector C are surrounded altogether by a braid member H. The braid member H is formed by weaving electrically conductive metal (for example, copper) thin wires in mesh form and shaping it into a tube. It is also possible to surround them with a metal film or a slitted metal film instead of the braid member H. One end of the braid member H is adhered to the outer circumference of the shield pipe 20 with a metal band K by means of crimping so as to be electrically conductive, while the other end is adhered to the connector C so as to be electrically conductive therebetween.

The shield pipe 20 is metallic (iron, aluminum, copper, stainless steel, or the like), and bent three-dimensionally along the routing path of the single core wires 10. Other than a metallic shield pipe, the shield pipe 20 may also be an electrically conductive resin pipe.

The shield pipe 20 is formed by unifying the paired segments (hereinafter, referred to as pipe segments 21) which are segmented substantially into halves along an axial direction, so as to be shaped into a tube allowing the single core wires 10 to be inserted into an interior thereof (see FIG. 4). The paired pipe segments 21 have the same shape, and are formed by extrusion molding.

The paired segments 21 are unified such that one end (referred to as first end 22, hereinafter) of opposite ends in a circumferential direction thereof is directed oppositely from the other end (referred to as second end 23, hereinafter), that is, such that the first end 22 of a first one of the pipe segments 21 is fitted to the second end 23 of the other pipe segment 21 while the second end 23 of the first one of the pipe segments 21 is fitted to the first end 22 of the other pipe segment 21.

The pair of the pipe segments 21 is provided with a first overlapping fitting portion 24 and a second overlapping fitting portion 25 which are fitted to each other in inward and outward directions for the unification. Both of the first overlapping fitting portion 24 and the second overlapping fitting portion 25 are formed at an inner circumference of the shield pipe 20.

The first overlapping fitting portion 24 is provided at a side of the first end 22 of each pipe segment 21. The first overlapping fitting portion 24 is provided to protrude in the unification direction of the paired pipe segments 21, and fitted to the inside of the second end 23 of the counterpart pipe segment 21.

The second overlapping fitting portion 25 is provided at a side of the second end 23 of each pipe segment 21. The second overlapping fitting portion 25 is formed into a tabular shape which is spaced apart from the second end 23 to be capable of receiving the first overlapping fitting portion 24 therebetween while protruding in the unification direction of the pipe segment 21. The second overlapping fitting portion 25 entirely covers the inside of the first overlapping fitting portion 24, and closes the clearance formed between fitted portions of the paired pipe segments 21. The front edge of the second overlapping fitting portion 25 (protruding edge) is abutted or located close to the inner circumferential surface of the counterpart pipe segment 21. The first overlapping fitting portion 24 and the second overlapping fitting portion 25 are provided continuously in the pipe segment 21 over its entire length.

The interior of the shield pipe 20 serves as a wire insertion portion 26 in which two single core wires 10 are inserted together. The wire insertion portion 26 is surrounded by arc-shaped portions (referred to as curves 27, hereinafter) of the inner circumferential surface of the shield pipe 20 and planar portions (referred to as planar portions 28, hereinafter) of the interior surfaces of the pair of second overlapping fitting portions 25. The wire insertion portion 26 is shaped substantially into an elongated circle, or oval, in the cross-section thereof by the pair of curves 27 and the pair of planar portions 28.

A spacer 40 is fitted inside of the shield pipe 20, for securely positioning the single core wires 10. The spacer 40 is made of a synthetic resin, and has an external shape fitted to the cross-sectional shape of the wire insertion portion 26 so as to be fitted to the interior of the shield pipe 20 with almost no clearance.

The spacer 40 is provided at an outer peripheral surface thereof with a pair of planar surfaces (referred to as planes 41, hereinafter) fitting to the second overlapping fitting portions 25 of the shield pipe 20. The planes 41 extend substantially in parallel to each other. Moreover, the spacer 40 is provided at the outer peripheral surface thereof with a pair of curved surfaces 42 smoothly curved along the curves 27 of the shield pipe 20.

The pair of planes 41 are abutted respectively to the planes 28 of the shield pipe 20, restricting the spacer 40 from being displaced in the abutting direction or rotated in the circumferential direction. The paired curved surfaces 42 are abutted respectively to the inner circumferential surfaces of the curves 27 of the shield pipe 20, restricting the spacer 40 from being displaced in the abutting direction. The spacer 40 is fitted to the interior of the shield pipe 20 while being restricted from displacement in four directions (displacement in directions orthogonal to the axial direction of the shield pipe 20).

Figure 4:
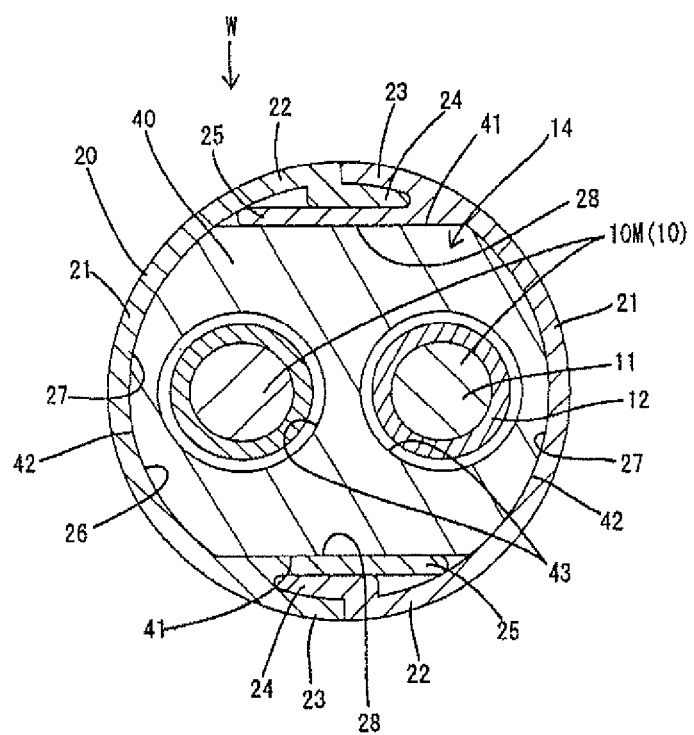
FIG. 4 is a cross-sectional view showing a cross-sectional shape of the shielded conductive path, and a cross-sectional view corresponding to a cross-section along A-A in FIG. 3.

The spacer 40 has insertion holes 43 in which the single core wires are inserted individually, as shown in FIG. 4. The number of the insertion holes 43 is the same as that of the single core wires 10 inserted into the shield pipe 20. Each insertion hole 43 runs through the spacer 40 in a front-back direction thereof. In this Example, the spacer 40 is provided with two insertion holes 43, which are disposed in a longitudinal direction thereof. That is, the holes 43 extend in a direction perpendicular to a plane of the spacer 40.

Each insertion hole 43 is formed to have a circular cross-sectional shape, which is fitted to the outer circumferential surface of the single core wire 10. Each insertion hole 43 is designed to have an inner diameter which is almost the same as the outer diameter of the single core wire 10, and provided with a minimum clearance capable of receiving the single core wire 10 therethrough.

The plurality of spacers 40 are fitted at portions in proximity to the curves 20R of the shield pipe 20, which are formed by means of a bending process. The spacers 40 are disposed at the center of the curve 20R, namely at the center in the axial direction of the curve, and at both of front and rear sides in the vicinity of the curve 20R. All of the spacers 40 fitted to the shield pipe 20 have the same shape.

Next, one example of fabrication work of the shielded conductive path W in this Example will be explained. First, the single core wire 10 is cut to a predetermined length. The lengths of three single core wires 10 are calculated on the basis of a predicted length (routing path length) of the routing path of each single core wire 10 in the shield pipe 20 processed by the bending process. Herein, at the curve 20R of the shield pipe 20, the single core wire 10 disposed on an inner side has a shorter routing path length than that the single core wire 10 disposed on an outer side. Then, the routing path length is calculated for each single core wire 10 on the basis of the predicted curve direction of each curve 20R and the position of each single core wire 10 and added to the routing path length at the linear parts of the single core wires 10. With this calculation, the length of the main portion 10M of the single core wire 10 is calculated for each single core wire 10. Next, the length of the protruding portion 10L is added to the length of the main portion 10M for calculation of the total length. Then, each single core wire 10 is cut to have a calculated length.

Next, the spacers 40 are attached to the three single core wires 10. The spacers 40 are inserted from one end side of the single core wire 10 such that single core wires 10 are inserted into the corresponding insertion holes 43 and disposed at predetermined positions (positions in proximity to the curve 20R of the shield pipe 20). All spacers 40 are sequentially attached so as to form a spacer-attached single core wire 14, in which the spacers 40 are attached to predetermined portions of three single core wires 10.

Next, the spacer-attached single core wire 14 is inserted into the shield pipe 20. First, the spacer-attached single core wire 14 is accommodated within one of the pair of pipe segments 21. At the same time, one end side of the single core wire 10 protrudes from the shield pipe 20 at a predetermined length (predicted length of protruding portion 10L).

Then, the other pipe segment 21 is coupled to the one pipe segment 21. When the paired pipe segments 21 are fitted to each other such that the first edge 22 and the second edge 23 are opposed to each other, the first overlapping fitting portion 24 and the second overlapping fitting portion 25 are fitted to each other with almost no clearance at the interior of the pair of pipe segments 21. The paired pipe segments 21 are coupled to form the tubular shield pipe 20 while the spacer-attached single core wire 14 is inserted through the wire insertion hole 26. Namely, three single core wires 10 are inserted into the shield pipe 20 while the spacers 40 are fitted at the predetermined portions. The protruding portion 10L in one end of the single core wire 10 which protrudes from the shield pipe 20 at the predetermined length is fixed so as not to be pulled inside of the shield pipe 20 in the bending process.

Next, the shield pipe 20 in which the single core wires 10 are inserted is formed into a predetermined shape by the bending process. The single core wires 10 are securely positioned at the respective portions with the spacers 40 and can be bent as expected by the bending process without being shuffled in their positions. With the spacers 40 fitted at the curves 20R of the shield pipe 20, it is possible to prevent the curves 20R of the shield pipe 20 from being broken or flattened.

Next, the other side (non-fixed side) of the single core wire 10 is pulled inside of the shield pipe 20 by the bending process. The single core wire 10 is displaced in relation to the spacers by sliding through the insertion hole 43 of each spacer 40. In this situation, the single core wire 10 extending through more outer sides at the curves 20R of the shield pipe 20 is pulled in to a larger extent, compared to the single core wire 10 extending through more inner sides. In this configuration, the protruding portion 10L of each single core wire 10 at the other edge side of the shield pipe 20 protrudes from the shield pipe 20 by the predicted length, allowing the lengths of the protruding portions 10L of both ends of the single core wire 10 to be predicted lengths.

Next, the stranded wire 30 is connected to both ends of the single core wires 10. In this connection, the ends of the single core wires 10, namely the portions connected to the stranded wire 30 are displaced stepwise in axial direction, facilitating the connection. Moreover, as the positions of the connection portions are not aligned in the axial direction, it is possible to prevent the width of the shielded conductive path W from being increased at those portions (prevent the shielded conductive path W from bulging).

With the above processes, the fabrication of the shielded conductive path W is completed.

Next, functions and advantageous effects of Example 1 configured in the above processes will be explained. The shielded conductive path W in this Example has the shield pipe 20 electromagnetically shielding the plurality of accommodated single core wires 10 each made of a single conductor 11 as a core wire. The spacers 40 with the insertion holes 43 respectively receiving single core wires 10 are fitted inside the shield pipe 20, while being restricted from displacement in the directions perpendicular to the axial direction of the shield pipe 20.

With this configuration, the single core wires 10 are securely positioned in the directions perpendicular to the axial direction of the shield pipe 20, facilitating the prediction of the length of the portions protruding from the shield pipe 20 processed by the bending process, and thereby making it possible to easily manage the length of the portion of the single core wire 10 protruding from the shield pipe 20.

In addition, the single core wires 10 are disposed apart from the inner circumferential surface of the shield pipe by way of the spacers 40. Therefore, even when clearances are generated between the paired pipe segments 21 and contaminants such as sand are filled inside the shield pipe 20, the single core wires 10 are prevented from coming into contact with the inner circumferential surface of the shield pipe 20, making it possible to prevent the single core wires 10 from rubbing the inner circumferential surface of the shield pipe 20 together with contaminants and to prevent the dielectric coating 12 from being worn.

The spacers 40 are fitted at the curves 20R of the shield pipe 20 formed by the bending process. In this configuration, the single core wires 10 are securely positioned at the curves 20R of the shield pipe 20 in which the single core wire 10 is the most easily displaced, making it possible to efficiently position the single core wires 10.

The shield pipe 20 is formed into a tubular shape capable of receiving therein the single core wires 10 by unifying the paired pipe segments 21 which are segmented along the axial direction. In this configuration, the spacer-attached single core wire 14 is arranged in one of the pipe segments 21, and then the pipe segment 21 is coupled to the other pipe segment 21 such that the spacers 40 and the single core wires 10 are disposed inside the shield pipe 20. Therefore, it is possible to facilitate the assembly compared to the case of inserting the spacer-attached single core wires 14 from one end of the shield pipe 20 to the other end thereof.

Example 2

Figure 5:
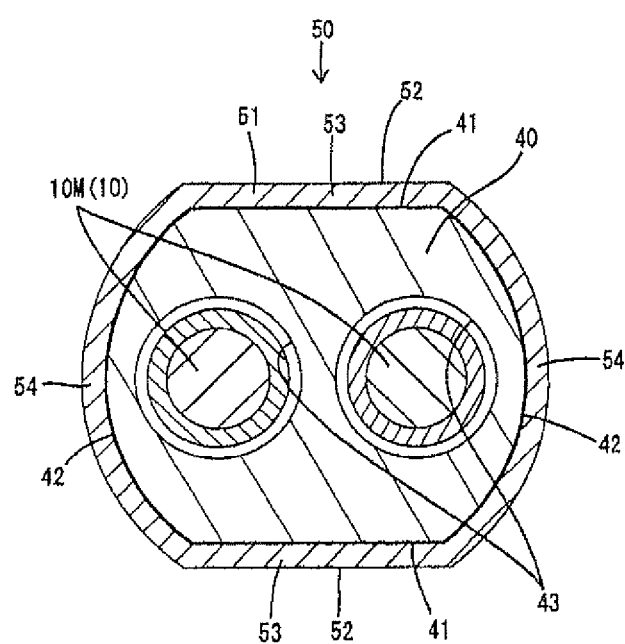
FIG. 5 is a cross-sectional view showing the shielded conductive path in Example 2.

Next, the shielded conductive path 50 according to Example 2 embodying the present disclosure will be explained with reference to FIG. 5. The shielded conductive path 50 in this Example differs from Example 1 in that the cross-sectional shape of the shield pipe 51 is arranged to have a flattened form elongated along a horizontal direction when installed in the vehicle B. The same symbols will be assigned to the same configuration as that of Example 1, and duplicate explanations will be omitted.

The shielded conductive path 50 according to this Example is provided with a shield pipe 51 electromagnetically shielding two inserted single core wires 10 each made of a single conductor 11 as a core wire, similarly to Example 1. The spacers 40 with the insertion holes 43 respectively receiving single core wires 10 are fitted inside the shield pipe 51, while being restricted from displacement in the directions perpendicular to the axial direction of the shield pipe 51. The spacers 40 are fitted at portions of the shield pipe 51 processed by the bending process, similarly to Example 1.

The shield pipe 51 is metallic, and bent three-dimensionally along the routing path of the single core wires 10, similarly to Example 1. The interior of the shield pipe 51 serves as the wire insertion hole 26 which is substantially an elongated circle and receives therethrough two single core wires 10 together. Other than a metallic shield pipe, the shield pipe 51 may also be an electrically conductive resin tube.

The shield pipe 51 is integrally formed by extrusion molding overall, and arranged to have a cross-sectional shape formed by cutting a perfect circular shaped shield pipe at portions serving as top and bottom sides when installed on the vehicle B. The cutout portion (referred to as cutout portion 52, hereinafter) of the shield pipe 51 is formed to extend from one end to the other end in the axial direction thereof over its entire length. The top and bottom sides of the shield pipe are cut out to the same extent.

Portions (referred to as cutout walls 53, hereinafter) of the cutout portions 52 in the peripheral wall of the shield pipe 51 extend substantially in parallel to each other. The top and bottom cutout walls 53 of the peripheral wall of the shield pipe 51 are connected to each other by arc walls 54 shaped into an arc.

To fabricate the shielded conductive path 50, the spacer-attached single core wire 14 is inserted from one end side of the shield pipe 51. In this process, a tape is wound to those portions of each single core wire 10 that are positioned in front of and behind the insertion hole 43, so as to prevent the spacers 40 from being displaced from a predetermined portion of the single core wires 10 during the assembly for insertion into the shield pipe 51.

As described above, according to this Example, in the shield pipe 51 electromagnetically shielding the two single core wires 10 inserted therein, the spacers 40 with the insertion holes 43 respectively receiving single core wires 10 are fitted, while being restricted from displacement in the directions perpendicular to the axial direction of the shield pipe 51.

With this configuration, similarly to Example 1, the single core wires 10 are securely positioned in the directions perpendicular to the axial direction of the shield pipe 51, facilitating the prediction of the length of the protruding portion 10L of the single core wire 10 processed by the bending process, and thereby making it possible to easily manage the length of the protruding portions 10L of the single core wires 10.

In addition, the shield pipe 51 has a flattened cross-sectional shape elongated along horizontal direction when installed on the vehicle B, making it possible to be compact in height thereof.

The shield pipe 51 has a cross-sectional shape formed by cutting the perfect circular shaped shield pipe at portions serving as top and bottom sides when installed on the vehicle B, making it possible to be compact in height by the cutout dimension in both top and bottom sides compared to the perfect circular shaped shield pipe. The shield pipe 51 has a substantially perfect circular shape in the other portions, and can be processed by the bending process with use of a bending machine which has been employed for bending process of the conventional perfect circular shaped shield pipe.

Example 3

Figure 6:
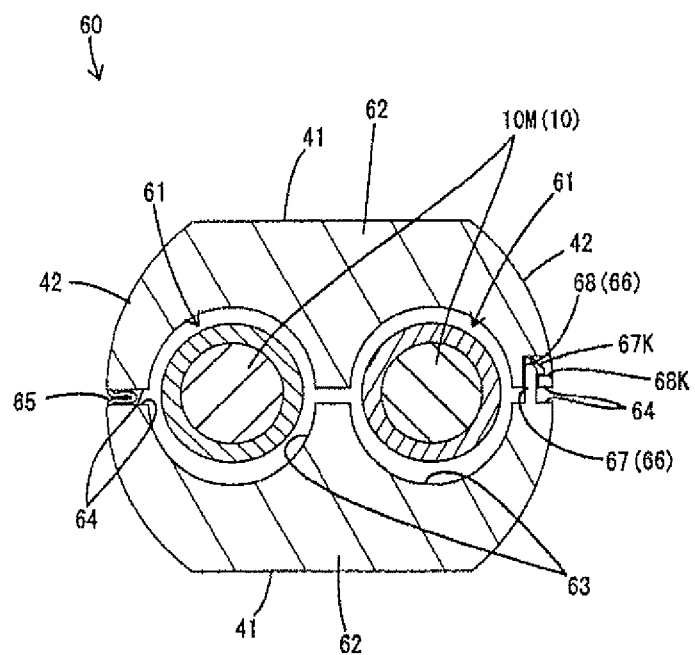
FIG. 6 is a cross-sectional view showing a spacer in Example 3.

Next, the shielded conductive path according to Example 3 embodying the present disclosure will be explained with reference to FIG. 6. The shielded conductive path 50 in this Example differs from Example 1 in that the spacer 60 has a pair of spacer segments (segments) 62 which are unified so as to interpose the single core wire 10 therebetween. The same symbols will be assigned to the same configuration as that of Example 1, and duplicated explanation will be omitted.

Similarly to Example 1, the shielded conductive path in this Example is provided with the shield pipe 20 electromagnetically shielding the two single core wires 10 each of which is inserted therein and made of a single conductor 11 as a core wire. The spacers 60 with the insertion holes 61 individually receiving therethrough single core wires 10 are fitted inside the shield pipe 20, while being restricted from displacement in the directions perpendicular to the axial direction of the shield pipe 20. Similarly to Example 1, the spacers 60 are fitted in at least the curves 20R of the shield pipe 20 which are processed by the bending process.

Each spacer 60 has paired spacer segments 62 which are unified so as to interpose the single core wire 10 therebetween. The paired spacer segments 62 have a form which is segmented so as to almost equally divide the insertion holes 61. The spacer segments have the same shape.

Each spacer segment 62 is provided with a recess 63, which is unified to another so as to form the insertion hole 61. Each recess 63 is recessed to form a semicircle shape in an abutted surface 64 which is abutted for the unification of the paired spacer segments.

The paired spacer segments 62 are connected to each other by way of a hinge 65. The hinge 65 is provided to one end side of the spacer segment 62 in a width direction thereof. In addition, the paired spacer segments 62 are provided with a lock portion 66, so as to be latched to each other for the unification and maintained at the unified state. The lock portion 66 is provided at an end opposite to the hinge 65 in the width direction of the spacer segment 62.

The lock portion 66 has a lock projection 67 provided to one of the paired spacer segments 62, and a lock recess 68 provided to the other spacer segment 62. The lock projection 67 is provided to protrude from the abutted surface 64 of one of spacer segments 62 in the unifying direction of the paired spacer segments 62. The lock projection 67 is provided at a front end thereof with a latching click (latch) 67K. The lock recess 68 is formed to be recessed at the abutted surface 64 of the other spacer segment 62, and capable of receiving the lock projection 67. The lock recess 68 is provided with a latch receiving portion 68K for allowing the received latching click 67K of the lock projection 67 to latch in a separating direction of the pair of spacer segments 62.

As described above, according to this Example, the spacers 60 with the insertion holes 61 respectively receiving single core wires 10 are fitted inside the shield pipe 20 electromagnetically shielding the two single core wires 10 inserted therein, while being restricted from displacement in the directions perpendicular to the axial direction of the shield pipe 20.

With this configuration, similarly to Example 1, the single core wires 10 are securely positioned in the directions perpendicular to the axial direction of the shield pipe 20, facilitating the prediction of the length of the protruding portion 10L of the single core wire 10 processed by the bending process, and thereby making it possible to easily manage the length of the protruding portions 10L of the single core wires 10.

Moreover, the spacers 60 have the paired spacer segments 62 which are unified to each other so as to interpose the single core wires 10 therebetween, and thereby can be attached at predetermined portions by unifying the paired spacer segments so as to interpose the predetermined portions of the single core wire 10. Therefore, it is possible to facilitate the assembly for attachment of the spacers 60, compared to the case of inserting the spacers 40 from one end of the single core wire 10 to the predetermined position.

Other Examples

The present disclosure is not limited to the Examples explained by the above description with reference to drawings, and the technical scope of the present disclosure includes the following Examples, for example:

(1) The above Examples are explained for the case that two single core wires 10 are inserted into the shield pipe 20 (51). But, the present disclosure is not limited to this case. Three or more single core wires may be inserted into the shield pipe. In this instance, each spacer is provided with the same number of insertion holes as there are single core wires. In case wires with different functions are present together in the plurality of single core wires inserted into the shield pipe, for example, in case the plurality of single core wires are composed of wires constituting a high voltage circuit and wires constituting a low voltage circuit, an outer periphery of the low-voltage shield wires and non-shield wires may be covered with a shield member made of a braid member, metal film or the like, in order to prevent it from being affected by noise of the high voltage circuit.

(2) In Example 1, the shield pipe 20 and the spacer 40 have flat surfaces which are fitted to each other for preventing the spacers from being rotated. But, the present disclosure is not limited to this means for the prevention of rotation. For example, the inner peripheral surface of the shield pipe or the outer peripheral surface of the spacers may be provided with a protrusion for the prevention of rotation, or the like.

(3) In Example 1, the insertion hole 43 has a circular cross-sectional surface. The present disclosure is not limited to this shape. The insertion hole 43 may have any cross-sectional shape or various shapes such as a quadrangular shape, an elliptical shape, or the like with a width equal to the outer diameter of the single core wire 10, for example.

(4) In Example 1, the spacers 40 have an exterior shape fitted to the wire insertion hole 26. The present disclosure is not limited to this shape. The shape of the spacers can be changed as suitable. For example, the spacers may be provided with a plurality of tubular portions which are provided at interiors thereof with insertion holes individually receiving therethrough single core wires, a connection portion connecting these with each other, and a supporting portion which protrudes outwardly from the tubular portion to be abutted to the inner circumferential surface of the shield pipe and supports the tubular portion at a predetermined portion in the shield pipe.

(5) In Example 1, the plurality of spacers 40 are fitted in proximity to the curved portions 20R. The present disclosure is not limited to this. The number of disposed spacers and the positions thereof can be changed as desired, and the spacers can be fitted also at the linear portions of the shield pipe as appropriate.

(6) In Example 1, the lengths of the protruding portions 10L of the plurality of single core wires 10 are changed stepwise. The present disclosure is not limited to these lengths. The length of the protruding portion can be determined appropriately.

(7) In Example 1, the shielded conductive path W is connected to the devices M1, M2 by way of the stranded wire 30 connected to both ends of the single core wire 10. but the present disclosure is not limited to this connection. For example, in case the shielded conductive path is connected to a relatively weakly vibrating device, it is possible to directly connect the end of the single core wire with the device, not by way of the stranded wire in the side of connecting with the device. This connection does not require the work for connecting the stranded wire with the single core wire, achieving a reduced cost, compared to the case of connecting the stranded wire with the end of the single core wire and then connecting to the device by way of the stranded wire, for example.

(8) In Example 1, the spacer-attached single core wire 14 which is formed by attaching the spacers 40 at predetermined portions in advance is interposed between the paired pipe segments 21. But the present disclosure is not limited to this. It is also possible to set the spacers at predetermined portions of one of the pipe segments and then insert the single core wires into the insertion holes of the spacers.

(9) In Example 1, the insertion holes 43 provided to the spacer 40 are closed in the circumferential direction. The present disclosure is not limited to this. When capable of supporting the single cores individually, the respective insertion holes 43 may be opened partially in the circumferential direction.

(10) In Example 1, the exterior shape of the shield pipe 20 is a perfect circular shape. The present disclosure is not limited to this shape. The exterior shape of the shield pipe may have any shape such that of an ellipse, elongated circle, rectangle, or the like.

(11) In Example 2, the shield pipe 20 has a cross-sectional shape with cutouts formed by cutting out at portions to be top and bottom sides when installed on the vehicle B. But the present disclosure is not limited to this. The shield pipe 20 may be formed by cutting out at only one of the top and bottom sides.

(12) In Example 2, the shield pipe 20 is provided at a circumferential wall thereof with the flattened cutout walls 53 and the arc-shaped arc wall 54 fitted to the perfect circular shape. The present disclosure is not limited to this. The shield pipe 20 may be formed into any shape, for example that of an ellipse, elongated circle, or rectangle, when formed to be flattened.

(13) In Example 3, the spacer 60 has the lock portion 66 so as to maintain the paired spacer segments 62 at the unified state. But the present disclosure is not limited to this. The paired spacer segments may also be maintained at the unified state with an adhesive or the like, for example.

(14) In Example 3, the spacer 60 has the hinge 65 for connecting the paired spacer segments 62 with each other. The present disclosure is not limited to this. The paired spacer segments may not be connected with each other.

What is claimed is:

1. A shielded conductive path comprising:

a shield pipe having a solid wall that has a length from a first end to a second end, the shield pipe electromagnetically shielding a plurality of single core wires inserted into the shield pipe, each single core wire being made of a single conductor as a core wire; and a spacer disposed in the shield pipe and spaced from the first end and from the second end, the spacer having a plurality of insertion holes, each of the plurality of insertion holes having an inner diameter that is greater than, but almost the same as, an outer diameter of each of the plurality of single core wires such that each of the plurality of insertion holes slidably receives one of the plurality of single core wires, wherein the spacer is fitted inside of the shield pipe while being restricted from displacement in directions perpendicular to an axial direction of the shield pipe, and wherein the spacer is restricted from rotation relative to the shield pipe.

2. The shielded conductive path according to claim 1, wherein the spacer is fitted at a curved portion of the shield pipe, the curved portion being formed by a bending process.

3. The shielded conductive path according to claim 2, wherein the spacer has a pair of segments, which are coupled so as to interpose the single core wires therebetween.

4. The shielded conductive path according to claim 3, wherein the shield pipe is formed into a tubular shape capable of receiving therein the single core wires by the coupling of a pair of shield pipe segments, the shield pipe being segmented along the axial direction.

5. The shielded conductive path according to claim 4, wherein the shield pipe has a flattened cross-sectional shape, which is elongated along a horizontal direction when installed on a vehicle.

6. The shielded conductive path according to claim 2, wherein the shield pipe is formed into a tubular shape capable of receiving therein the single core wires by the coupling of a pair of shield pipe segments, the shield pipe being segmented along the axial direction.

7. The shielded conductive path according to claim 6, wherein the shield pipe has a flattened cross-sectional shape, which is elongated along a horizontal direction when installed on a vehicle.

8. The shielded conductive path according to claim 2, wherein the shield pipe has a flattened cross-sectional shape, which is elongated along a horizontal direction when installed on a vehicle.

9. The shielded conductive path according to claim 1, wherein the spacer has a pair of segments, which are coupled so as to interpose the single core wires therebetween.

10. The shielded conductive path according to claim 1, wherein the shield pipe is formed into a tubular shape capable of receiving therein the single core wires by the coupling of a pair of shield pipe segments, the shield pipe being segmented along the axial direction.

11. The shielded conductive path according to claim 1, wherein the shield pipe has a flattened cross-sectional shape, which is elongated along a horizontal direction when installed on a vehicle.

12. The shielded conductive path according to claim 1, wherein the single core wires extend from a first connector configured to electrically couple the single core wires with a first electrical device to a second connector configured to electrically couple the single core wires with a second electrical device.

13. A shielded conductive path comprising:
   a shield pipe having a solid wall that has a length from a first end to a second end, the shield pipe being configured to electromagnetically shield a plurality of single core wires held within the shield pipe, each of the single core wires being made of a single conductor as a core wire; and
   a spacer disposed in the shield pipe and spaced from the first end and from the second end, the spacer having a plurality of insertion holes, each of the plurality of insertion holes having an inner diameter that is greater than, but almost the same as, an outer diameter of each of the plurality of single core wires such that each of the plurality of insertion holes slidably receives one of the plurality of single core wires, the spacer being fitted inside of the shield pipe, the spacer being (i) restricted from displacement in directions perpendicular to an axial direction of the shield pipe, and (ii) restricted from rotation relative to the shield pipe.

14. The shielded conductive path according to claim 13, wherein the shield pipe is bent at a location along the axial direction to form a curved portion of the shield pipe, the spacer being fitted at the curved portion of the shield pipe.

15. The shielded conductive path according to claim 13, wherein the spacer comprises a pair of segments, the pair of segments being coupled together so as to interpose the single core wires therebetween.

16. The shielded conductive path according to claim 13, wherein the shield pipe is segmented along the axial direction into a pair of shield pipe segments, the pair of shield pipe segments being coupled together to form a tubular shape configured to receive the single core wires therein.

17. The shielded conductive path according to claim 13, wherein the shield pipe has a flattened cross-sectional shape, which is elongated along a horizontal direction when installed on a vehicle.

18. A method of assembly a shielded conductive path, the method comprising:
   providing a shield pipe having a solid wall that has a length from a first end to a second end, the shield pipe being configured to electromagnetically shield a plurality of single core wires held within the shield pipe, each of the single core wires being made of a single conductor as a core wire; and
   fitting a spacer inside of the shield pipe, the spacer being spaced from the first end and from the second end, the spacer being restricted from displacement in directions perpendicular to an axial direction of the shield pipe and being restricted from rotation relative to the shield pipe, the spacer having a plurality of insertion holes, each of the plurality of insertion holes having an inner diameter that is greater than, but almost the same as, an outer diameter of each of the plurality of single core wires such that each of the plurality of insertion holes slidably receives one of the plurality of single core wires.

19. The method of claim 18, further comprising:
   bending the shield pipe at a location along the axial direction to form a curved portion of the shield pipe,
   wherein, the step of fitting the spacer includes fitting the spacer at the curved portion of the shield pipe.

20. The method of claim 18, further comprising:
   forming the spacer as a pair of segments, the pair of segments being coupled together so as to interpose the single core wires therebetween.

21. The method of claim 18, wherein the step of providing a shield pipe comprises:
   providing a pair of shield pipe segments, the pair of shield pipe segments being coupled together such that the shield pipe is segmented along the axial direction, the pair of shield pipe having a tubular shape configured to receive the single core wires therein.

* * * * *